(12) United States Patent
Chen et al.

(10) Patent No.: US 6,846,509 B2
(45) Date of Patent: Jan. 25, 2005

(54) ROOM TEMPERATURE LUMINESCENT ERBIUM OXIDE THIN FILMS FOR PHOTONICS

(75) Inventors: Kevin M. Chen, Santa Clara, CA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 341 days.

(21) Appl. No.: 09/991,438

(22) Filed: Nov. 21, 2001

(65) Prior Publication Data

US 2004/0224082 A1 Nov. 11, 2004

Related U.S. Application Data

(60) Provisional application No. 60/252,845, filed on Nov. 22, 2000.

(51) Int. Cl.[7] .............................. B05D 3/02; B05D 5/12; C23C 14/00
(52) U.S. Cl. ........................ 427/66; 427/74; 427/126.3; 427/166; 427/380; 204/192.15; 204/192.26
(58) Field of Search ............................ 427/66, 380, 74, 427/126.3, 162, 163.1, 163.2, 166, 376.2, 376.6, 383.5; 204/192.15, 192.26

(56) References Cited

U.S. PATENT DOCUMENTS

| | | | | |
|---|---|---|---|---|
| 6,194,818 B1 | * | 2/2001 | Sumi et al. ................. | 310/311 |
| 6,201,271 B1 | * | 3/2001 | Okutoh et al. .............. | 257/295 |
| 6,416,584 B1 | * | 7/2002 | Won et al. .................. | 118/715 |

FOREIGN PATENT DOCUMENTS

| JP | 17217 | * | 1/1999 |
|---|---|---|---|

OTHER PUBLICATIONS

"Resonant excitation of visible photoluminescence from an erbium–oxide overlayer on Si," Kasuya et al. *Applied Physics Letters*. Nov. 10, 1997. vol. 71, No. 19.

"The Chemical Environment of $Er^{3+}$In a–Si:Er:H AND a–Si:Er:O:H," Tessler et al. *Materials Research Society*. 1998. vol. 524.

* cited by examiner

*Primary Examiner*—Brian K. Talbot
(74) *Attorney, Agent, or Firm*—Gauthier & Connors LLP

(57) ABSTRACT

A system for producing Erbium Oxide thin films with increased photoluminescence. The system includes a depositing stage for forming Erbium Oxide molecules by reacting Erbium sputtered atoms with $O_2$ in a gas phase and creating the Erbium Oxide thin film by depositing the Erbium Oxide molecules on a substrate coated with Silicon Oxide. The system further includes an annealing stage for annealing the Erbium Oxide thin films by utilizing a low temperature treatment for a specified amount of time and temperature followed by a high temperature treatment for another specified amount of time and temperature, wherein the crystallinity of the thin films has improved.

9 Claims, 4 Drawing Sheets

ROOM TEMPERATURE LUMINESCENT ERBIUM OXIDE THIN FILMS FOR PHOTONICS

PRIORITY INFORMATION

This application claims priority from provisional application Ser. No. 60/252,845 filed Nov. 22, 2000.

BACKGROUND OF THE INVENTION

The invention relates to the field of room temperature photoluminescence (PL) from Erbium Oxide thin films. There have been various methods of forming Erbium Oxide thin films that have proven to be inefficient to provide sufficient PL at room temperature. Thermal evaporation, E-beam evaporation of powder, and laser ablation are techniques that required using high temperatures to oxidize $O_2$ with metals, such as Erbium. Once the Erbium oxidizes with $O_2$ to form Erbium Oxide, the Erbium Oxide is deposited on a substrate, thus forming a Erbium Oxide thin film. Afterwards, the Erbium Oxide thin film is annealed once in high temperatures for a short period of time and removed. This annealing process attempted to improve the photoluminescence of the Erbium Oxide thin film by increasing the crystallinity of the structure, such attempts have proven to be unsuccessful.

Thus, there is a need in the art to provide a technique to improve the photoluminescence of Erbium Oxide thin films at room temperature.

SUMMARY OF THE INVENTION

Accordingly, the invention obtains room temperature photoluminescence (PL) for Erbium Oxide thin films via reactive sputtering of Er metal in $Ar/O_2$ and subsequently annealed in $O_2$. The Erbium Oxide films are the key component in Si-based light emitters operating at room temperature. Thus, the present invention allows development of new devices, which results in producing room temperature photoluminescence (PL) in Erbium Oxide thin films.

According to one aspect of the invention, a method for increasing photoluminescence in Erbium Oxide thin films is provided. The method includes the step of forming Erbium Oxide molecules by reacting Erbium sputtered atoms with $O_2$ in a gas phase. The method also includes the step of creating the Erbium Oxide thin films by depositing the Erbium Oxide molecules on a substrate coated with Silicon Oxide. The method further include the step of annealing the Erbium Oxide thin films by utilizing a low temperature treatment for a specified amount of time and temperature followed by a high temperature treatment for another specified amount of time and temperature, wherein the temperature treatments increases crystallinity of the thin film.

According to another aspect of the invention, a process for increasing the photoluminescence of Erbium Oxide thin films is provided. The process includes the step of forming Erbium Oxide molecules by reacting Erbium sputtered atoms with $O_2$ in a gas phase. The process also includes the step of creating the Erbium Oxide thin films by depositing the Erbium Oxide molecules on a substrate coated with Silicon Oxide. The process further include the step of annealing the Erbium Oxide thin films by utilizing a low temperature treatment for a specified amount of time and temperature followed by a high temperature treatment for another specified amount of time and temperature, wherein the temperature treatments increases crystallinity of the thin film.

According to another aspect of the invention, a system for producing an Erbium Oxide thin film with increased photoluminescence at room temperature is provided. The system includes a depositing stage for forming Erbium Oxide molecules by reacting Erbium sputtered atoms with $O_2$ in a gas phase and creating the Erbium Oxide thin film by depositing the Erbium Oxide molecules on a substrate coated with Silicon Oxide. The system further includes an annealing stage for annealing the Erbium Oxide thin films by utilizing a low temperature treatment for a specified amount of time and temperature followed by a high temperature treatment for another specified amount of time and temperature, wherein the temperature treatments increases crystallinity of the thin film.

DETAILED DESCRIPTION OF THE INVENTION

Erbium oxide ($Er_2O_3$) is a vitally important luminescence material for two main reasons. First, the $Er^{3+}$ f-shell transition is near 1.55 $\mu$m, coinciding with the loss minimum for silica optical fibers. Second, the equilibrium concentration of $Er^{3+}$ ions in the rare earth oxide can be greater by several orders of magnitude over Er doped systems. The higher concentration allows access to higher luminescence intensities and may enable devices such as compact emitters and optical amplifiers for integrated planar lightguide circuits (PLCs).

Figure 1:
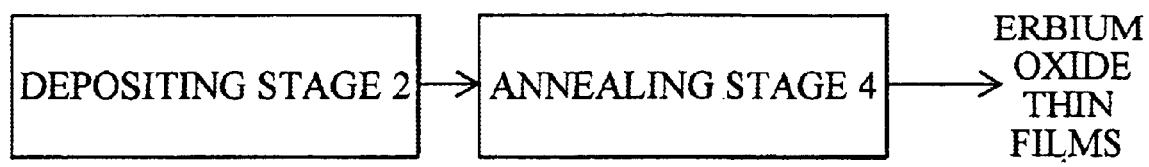
FIG. 1 illustrates a block diagram of the illustrative embodiment of the present invention.

FIG. 1 illustrates a block diagram on the production of Erbium Oxide thin films. In particular, thin films of Erbium Oxide are fabricated via a respective depositing stage 2 of Er metal. The depositing stage 2 utilizes a magnetron within ultra high vacuum conditions ($<5\times10^{-9}$ torr) that ensure low contamination within the film by unwanted species. Enroute to deposition onto the substrate, the sputtered Er atoms react in the gas phase with $O_2$ to form the Erbium Oxide. The substrate is pre-coated with a film of $SiO_2$ on which the Erbium Oxide is deposited. The $SiO_2$ coating is important because it allows the Erbium Oxide to adhere during the course of subsequent annealing which is explained more below.

The illustrative embodiment provides an annealing stage 4 for annealing the various Erbium Oxide thin film samples. The annealing stage 4 main objective is to increase photoluminescence intensity and reduce linewidth while keeping thickness constant. As shown in FIG. 1, following the deposition performed by the deposition stage 2 the film is annealed by the annealed stage 4. The annealed stage 4 may include a conventional tube furnace under $O_2$ ambient. The annealed stage 4 allows additional oxygen atoms to be incorporated into the lattice. Also, the annealed stage 4 improves the crystallinity so that the concentration of optically active Erbium is increased. The annealed stage 4 anneals the Erbium Oxide films in $O_2$ overpressure. The annealed stage 4 may also utilize Ar or $N_2$ overpressures.

The annealed stage 4 uses a low temperature treatment and high temperature treatment annealing procedure. The illustrative embodiment introduces the various Erbium Oxide film samples into and removes the samples from the furnace within a two minute interval to avoid temperature ramping effects. This technique allows the crystallinity to be further increased.

Figure 2:
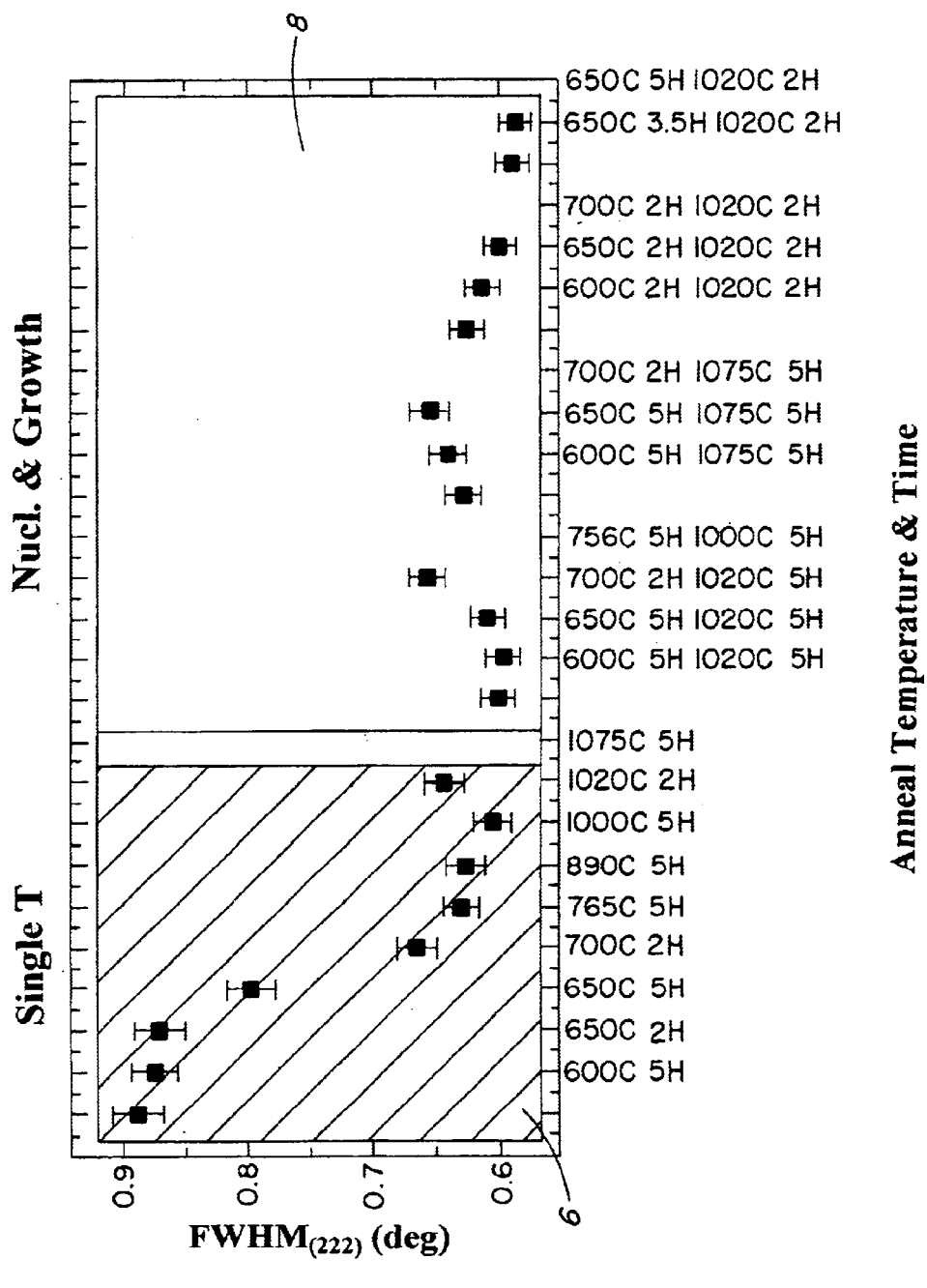
FIG. 2 illustrates the crystallanity Erbium Oxide thin film after various annealing schedules.

FIG. 2 illustrates the crystallinity after various annealing schedules. The resulting cystallanity after various annealing schedules is characterized by the FWHM of (222) diffraction peak. FIG. 2 illustrates the FWHM of (222) diffraction peak for a single step anneal (graph 6) and the inventive two-step anneal (graph 8). When samples are treated using a single-step anneal, there is a maximum crystallanity achieve when 1020° C. is used, as shown in graph 6. By utilizing the annealed stage two-step process in which low temperature treatment step is followed by a high temperature treatment step, the crystallinity is further increased. For example, a 650° C. 5 hr anneal followed by a 1000° C. 2 hr treatment, as shown in graph 8, results in microstructures consisting of a distribution of large and small grains, demonstrating grain growth via coarsening. The low temperature serves to nucleate the grains, which then grow via diffusion at the high temperature. Further analysis by a transmission electron microscopy (TEM) shows grains as large as 50 nm in diameter.

The gauge of crystallinity is the xray diffraction peak width of Erbium Oxide crystals, the (222) peak. The narrower the peak width the higher the crystallinity. Also, the tighter the peak width, the tighter the distribution of $Er_xO_y$ stoichiometry. The stoichiometry drives the PL lineshape and also drives PL behavior with temperature. Graph 8 demonstrates across the anneal temperature and time range that the (222) peak diffraction has much narrower and tighter peak width as compared to graph 6. Thus, this shows that the inventive two-step annealed process improves the crystallinity at a higher rate than the single step anneal. The 650° C. 5 h, 1020° C. 2 h anneal point in graph 8 is the optimum for crystal growth and nucleation.

☐ During the crystallization process, the volume of the film changes, thus creating internal stresses. These stresses lead to local delamination characterized by visible circular pits in the film. A high density of these pits make the film appears hazy and renders the film useless for optical purposes due to high loss via scattering. As discussed above, the $SiO_2$ layer serves two important purposes.

First, the film provides adhesion to the Erbium Oxide than the Si substrate. This occurs because the interdiffusion at the Erbium Oxide/ $SiO_2$ interface during the anneal process accomplished by the annealed stage 2, which increases the binding strength between the films. Plus, the $SiO_2$ film buries the Si substrate surface that has been exposed to the atmosphere. Since the Si substrate surface is no longer a factor, the Erbium Oxide film can be directly deposited on a freshly grown $SiO_2$ surface within the ultrahigh vacuum. This enables processing in non-cleanroom environments, thereby increasing manufacturing flexibility while saving enormous costs.

The second purpose is that the $SiO_2$ layer is able to accommodate the stress buildup in the Erbium Oxide layer, allowing the film to relax. Stress accommodation prevents pitting/delamination to a certain extent. Even with the $SiO_2$ intermediate layer, there is a critical thickness of Erbium Oxide above which the annealed Erbium Oxide film will begin to pit and/or delaminate.

Figure 3:
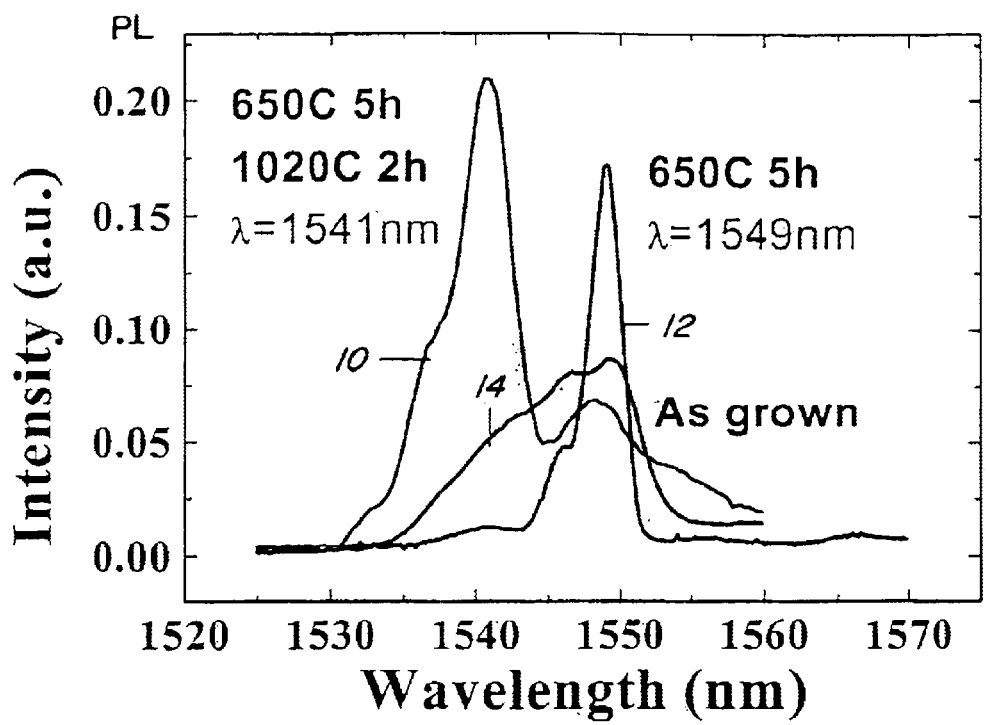
FIG. 3 illustrates the photoluminescence (PL) spectrum of the annealed samples.

FIG. 3 illustrates a PL spectrum of various thin film samples. The photoluminescence (PL) spectrum is also related to the film crystallinity. In particular, FIG. 3 illustrates various PL spectrums for a sample 10 annealed using the inventive two-annealed process at 650° C. 5 h, 1020° C. 2 h, a sample 12 using the single step annealed at 650° C. 5 h, and a sample 14 for the standard non-annealed structure. The sample 12 gives off an inhomogeneous broad PL signal centered near 1549 nm. On the contrary, for sample 10 annealed by the annealed stage 4, there is a sharp peak at 1541 nm signifying that the optically active Er—O complexes have obtained longer-range order upon heat treatment. The photoluminescence spectrum also reveals transitions between lower energy levels with the $Er^{3+}$ 4f-shell manifold. Thus, sample 10 clearly demonstrates a higher intensity at a smaller wavelength as compared to sample 12, which essentially demonstrates more crystallinity and growth within sample 12.

Figure 4:
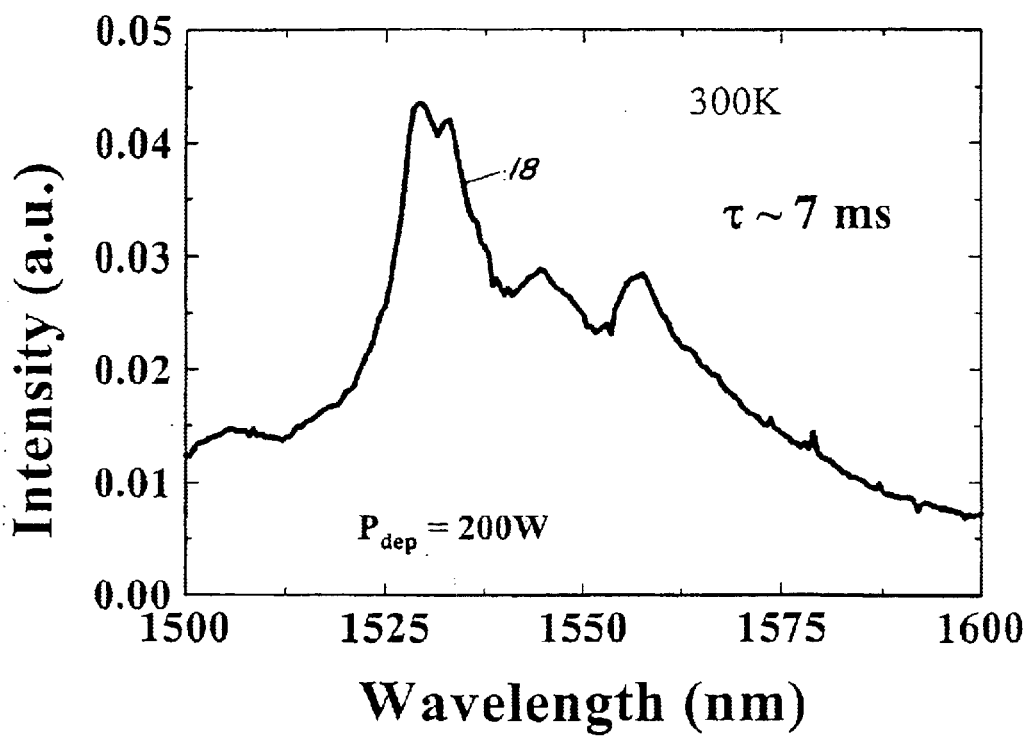
FIG. 4 illustrates the PL at room temperature of a sample annealed with the inventive anneal two step process
Figure 5:
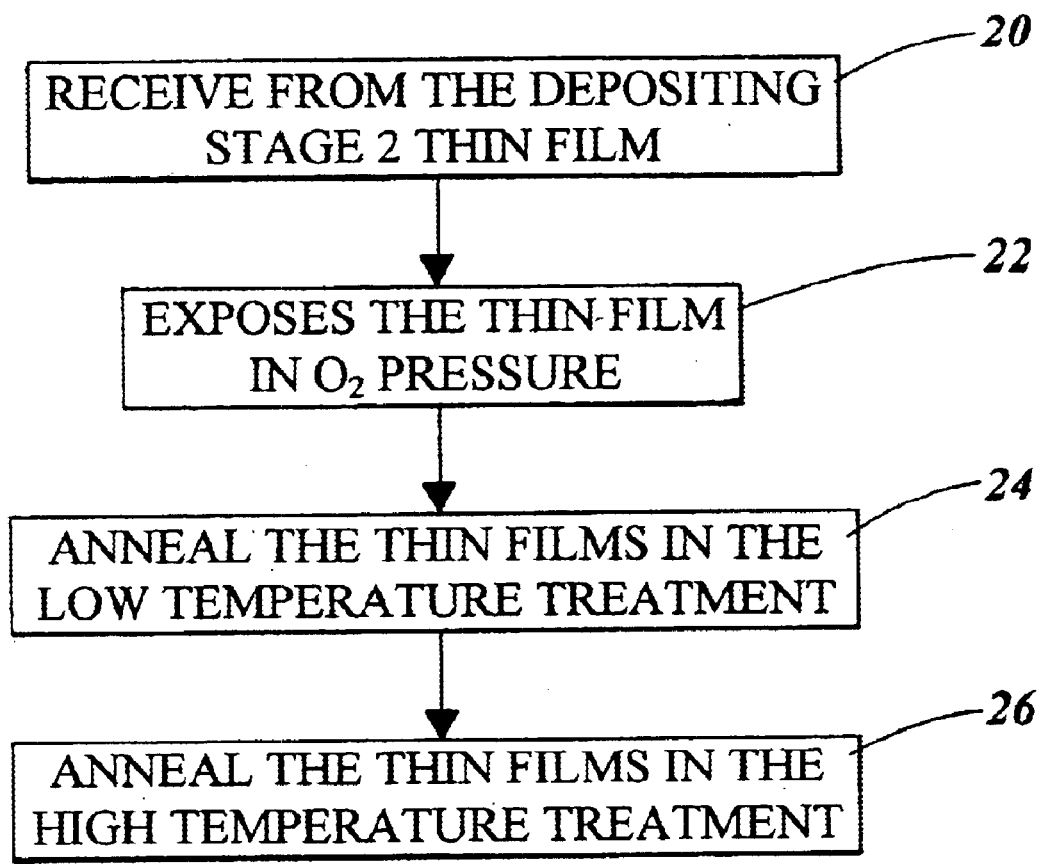
FIG. 5 illustrates the steps required for the annealing the Erbium Oxide thin film.

FIG. 4 illustrates the PL at room temperature of a sample annealed with the inventive anneal two-step process. Most photoluminescence signals from single annealed samples quench slightly when operable temperature is increased but maintain their general shape up to room temperature. FIG. 5 demonstrates a PL spectrum 18 of a sample annealed using techniques in annealed stage 4 with a plasma power $P_{dep}$ of 200 W and a luminescence lifetime of 7 msec. The lifetime is long compared to Er doping via other prior art techniques, which indicates that the effect of the nucleation and growth anneal is an increase in the number of optically active Er—O complexes while removing non-radiative recombination pathways. As mentioned above, during anneal, the film consumes $O_2$ from the ambient, lowering its refractive index to 1.92. This value is close to the reported index of bulk of Erbium Oxide of 1.9. The PL spectrum 18 also maintains its PL spectral shape (FIG. 3, sample 10) at room temperature. The standard nonlinear behaviors that occur at room temperature are minimized, because of the increased crystallinity of the sample.

FIG. 5 illustrates the detailed steps accomplished by the annealed stage 4. As mentioned above, the annealed stage 4 may anneal a film of Erbium Oxide in a conventional tube furnace under $O_2$ ambient. This increases the photoluminescence intensity and reduces linewidth while keeping film thickness the constant. The annealed stage 4 receives from the depositing stage 2 a thin film that includes deposited layer of Erbium Oxide (step 20). The annealed stage 4 further exposes the thin film in an $O_2$ pressure (step 22). Essentially, the $O_2$ overpressure adds oxygen atoms to the lattice, and increases the concentration of optically active Er is increased. For purposes of grain coarsening, the annealed stage 4 utilizes are two-step annealing procedure. The two-step annealing procedure uses changes in temperature to further increase efficiency. In particular, the annealed stage 4 engages the thin film to a low temperature treatment for specified amount of time and temperature (step 24). Afterwards, the annealed stage 4 exposes the thin film to a high temperature treatment for another specified amount of time and temperature (step 26). The annealing time and temperature for the low temperature treatment and high temperature treatment may be systematically varied between 2–20 hrs and 600–1050° C. to promote an advance level of grain coarsening. However, the major requirement is that the actual temperature for the low temperature treatment must be lower than the actual temperature of high temperature treatment.

When selecting a heat treatment in the annealed stage 4 one must be aware of the various differences for integration of the material into a multicomponent system or process. Dependent on the use of the films the temperature for low temperature treatment and high temperature treatment significantly determines the quality of Erbium Oxide thin film, but the other components may not be compatible at such temperatures. However, the illustrative embodiment provides a technique for utilizing annealing temperatures to influence the luminescence wavelength as well room temperature performance Erbium Oxide thin films.

In particular, highly luminescent Erbium Oxide films are the key component in a demonstration of Si-based light emitters operating at room temperature. Important new devices have resulted from this work. Recently, a Si-based room temperature light emitter consisting of sputtered Erbium Oxide films has been fabricated using the techniques disclosed above, demonstrating promise for an integrated light source using CMOS-compatible processing. Additional experiments point to the possibility of achieving higher intensity light emission and light amplification as previously disclosed above.

Although the present invention has been shown and described with respect to several preferred embodiments thereof, various changes, omissions and additions to the form and detail thereof, may be made therein, without departing from the spirit and scope of the invention.

What is claimed is:

1. A method of increasing the photoluminescence of an Erbium Oxide thin film at room temperature, comprising:

forming Erbium Oxide molecules by reacting Erbium sputtered atoms with $O_2$ in a gas phase;

creating the Erbium Oxide thin film by depositing the Erbium Oxide molecules on a substrate coated with Silicon Oxide; and annealing the Erbium Oxide thin film by utilizing a low temperature treatment for a specified amount of time and temperature followed by a high temperature treatment for another specified amount of time and temperature, wherein said temperature treatments increases crystallinity of the thin film.

2. The method of claim 1, wherein forming Erbium Oxide molecules further includes creating a vacuum.

3. The method of claim 2, wherein the vacuum is an ultra high vacuum of less than $5 \times 10^{-9}$ torr.

4. The method of claim 1, wherein annealing the Erbium Oxide thin film further includes utilizing a furnace.

5. The method of claim 4, wherein the furnace is a conventional tube furnace under $O_2$ ambient.

6. The method of claim 4, wherein annealing the Erbium Oxide thin film further includes the step of adding oxygen to a lattice of the thin films.

7. The method of claim 4, wherein annealing the Erbium Oxide thin film further includes the step of exposing the thin films to an $O_2$ overpressure.

8. The method of claim 1, wherein the time and the temperature of the low temperature treatment varies between 2–20 hrs and 600–1050° C.

9. The method of claim 1, wherein the time and temperature of the high temperature treatment varies between 2–20 hrs. and 600–1050° C.

* * * * *

UNITED STATES PATENT AND TRADEMARK OFFICE
CERTIFICATE OF CORRECTION

PATENT NO. : 6,846,509 B2
DATED : January 25, 2005
INVENTOR(S) : Chen et al.

It is certified that error appears in the above-identified patent and that said Letters Patent is hereby corrected as shown below:

Column 1,
Line 5, insert the following new paragraph:
-- This invention was made with government support under Grant Number DMR-9808941, awarded by NSF. The government has certain rights in the invention. --

Signed and Sealed this

Nineteenth Day of April, 2005

JON W. DUDAS
*Director of the United States Patent and Trademark Office*